United States Patent [19]
Jefferson et al.

[11] Patent Number: 5,297,076
[45] Date of Patent: Mar. 22, 1994

[54] SPECTRAL HOLE BURNING DATA STORAGE SYSTEM AND METHOD

[75] Inventors: Carl M. Jefferson, San Jose, Calif.; Alfred J. Meixner, Winterthur, Switzerland

[73] Assignee: International Business Machines Corporation, Armonk, N.Y.

[21] Appl. No.: 902,621

[22] Filed: Jun. 23, 1992

[51] Int. Cl.$^5$ ............................................. G11C 13/04
[52] U.S. Cl. .................... 365/119; 365/106; 365/215
[58] Field of Search .............. 365/106, 119, 153, 215, 365/234; 250/551, 225, 226; 359/260, 245, 279, 306, 320, 331

[56] References Cited

U.S. PATENT DOCUMENTS

| | | | |
|---|---|---|---|
| 3,896,420 | 7/1975 | Szabo | 340/173 CC |
| 4,101,976 | 7/1978 | Castro et al. | 365/119 |
| 4,158,890 | 6/1979 | Burland | 365/119 |
| 4,297,035 | 10/1981 | Bjorklund | 356/402 |
| 4,306,771 | 12/1981 | Bjorklund | 350/311 |
| 4,533,211 | 8/1985 | Bjorklund et al. | 350/162.12 |
| 4,614,116 | 9/1986 | Huston et al. | 359/285 X |
| 4,962,479 | 10/1990 | Imai et al. | 365/106 X |
| 5,136,599 | 8/1992 | Wilcox | 385/31 X |
| 5,191,574 | 3/1993 | Henshaw et al. | 365/113 X |
| 5,204,770 | 4/1993 | Kachru et al. | 365/119 X |

OTHER PUBLICATIONS

W. Lenth and W. E. Moerner, "Gated Spectral Hole-Burning for Frequency Domain Optical Recording," Optics Communications, vol. 58, No. 4, Jun. 1986.

M. Yoshimura, et al., "Photochemical Hole Burning of Anthraquinone Derivatives in Acrylic Polymers," Chemical Physics Letters, vol. 143, No. 4, Jan. 22, 1988.

Babbitt and T. Mossberg, "Time Domain Frequency Selective Optical Data Storage in a Solid State Material," Optics Communications, vol. 65, No. 3, Feb. 1, 1988.

Y. Bai, et al., "Coherent Transient Optical Pulse Shape Storage/Recall Using Frequency-Swept Excitation Pulses," Optics Letters, vol. 11, p. 724, Nov. 1986.

J. Zhang, et al., "Use of Phase-Noisy Laser Fields in the Storage of Optical Pulse Shapes in Inhomogeneously Broadened Absorbers," Optics Letters, vol. 16, No. 2, Jan. 15, 1991.

T. Mossberg, "Time Domain Frequency Selective Optical Data Storage," Optics Letters, vol. 7, No. 2, Feb. 1982.

M. Mitsunaga, et al., "248 Bit Optical Data Storage in $Eu^{3+}$; $YAlO_3$ By Accumulated Photon Echoes," Optics Letters, vol. 15, No. 3, Feb. 1, 1990.

M. Mitsunaga, et al., "Effects of Hyperfine Structures on an Optical Stimulated Echo Memory Device," Optics Letters, vol. 11, No. 5, May 1986.

M. Mitsunaga, "CW Photon Echo: Theory and Observations," Physical Review A, vol. 42, No. 3 Aug. 1, 1990.

R. M. McFarlane, et al., "Sub-Kilohertz Optical Linewidths of the $^7F_0 \rightleftarrows {}^5D_0$ Transition in $Y_2O_3:Eu^{3+}$," Optics Communications, vol. 39, No. 3, Oct. 1, 1981.

N. N. Askmediev, "Information Erasing in the Phenomenon of Long-Lived Photon Echo," Optics Letters, vol. 15, No. 18, Sep. 15, 1990.

*Primary Examiner*—Eugene R. LaRoche
*Assistant Examiner*—Do Hyun Yoo
*Attorney, Agent, or Firm*—Douglas R. Millett

[57] ABSTRACT

Phase modulation is used to record data in a spectral hole burning material. A laser and a phase modulator are used to generate both a reference pulse and a phase modulated data pulse to the material. The data is recorded as spectral holes in the absorption spectrum of the material. In order to read the data, a second reference pulse is generated which creates an echo pulse from the material. This echo pulse is combined with a frequency shifted comparator pulse in order to generate a heterodyne signal. A phase sensitive demodulator detects the phase transitions in the heterodyne signal and generates a digital signal representative of the data recorded.

16 Claims, 3 Drawing Sheets

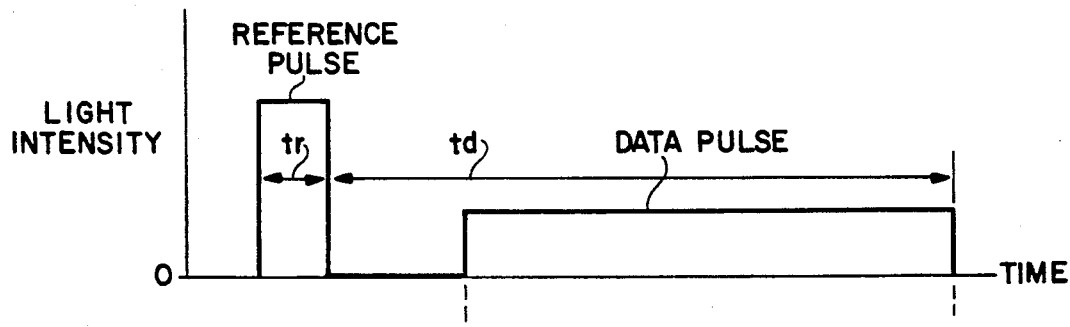
FIG_2A
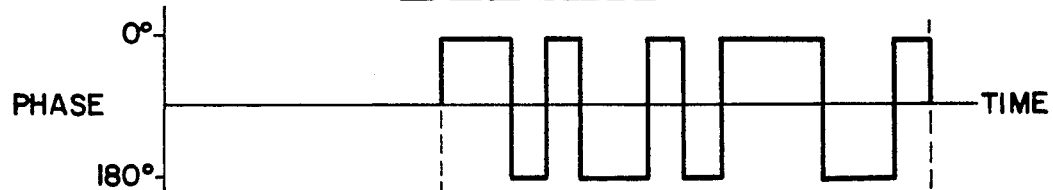
FIG_2B
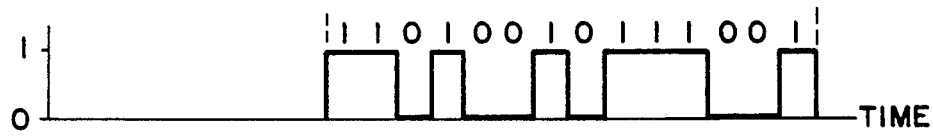
FIG_2C
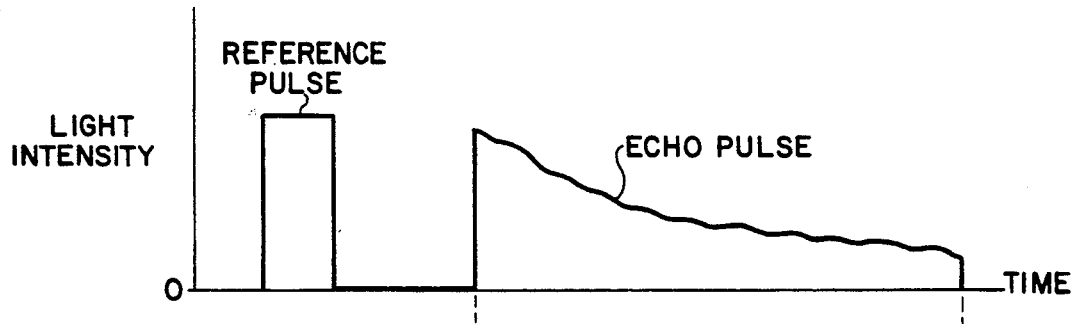
FIG_3A
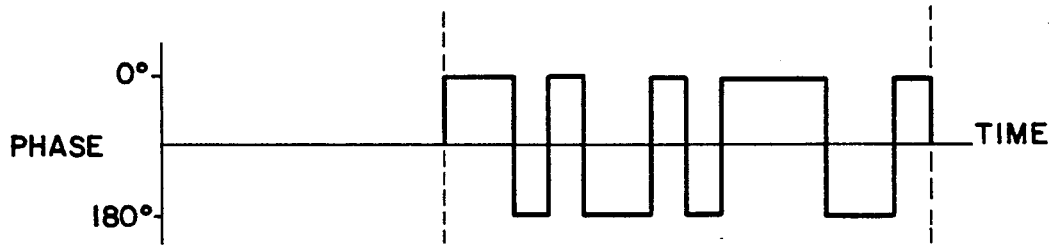
FIG_3B
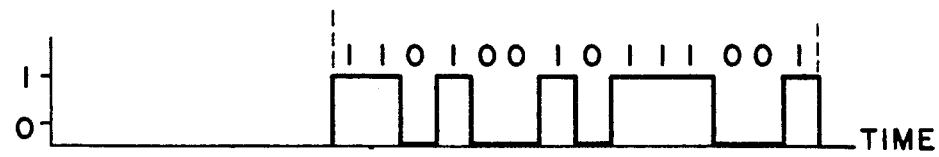
FIG_3C

SPECTRAL HOLE BURNING DATA STORAGE SYSTEM AND METHOD

BACKGROUND OF THE INVENTION

1. Field of the Invention

This invention relates generally to spectral hole burning data storage systems and more specifically to such a system which uses phase modulation.

2. Description of the Prior Art

There are inhomogeneously broadened materials which have broad optical absorption spectrums. At low temperatures, these materials exhibit spectral hole burning phenomenon. This phenomenon involves the use of a laser to photochemically modify a material's optical absorption spectrum at selected frequencies. The atoms at these frequencies have been altered so that they no longer absorb light at these frequencies. The resulting optical absorption spectrum of the material appears to have frequency dependent holes in it, hence the name of spectral hole burning.

Various schemes have been proposed to use spectral hole burning to store data. The simplest scheme is frequency domain optical recording and involves using discrete frequency bands as digital data storage positions. The material's optical frequency spectrum is divided into a large number of small data frequency bands. Each frequency band corresponds to a bit position. A frequency variable laser is used to selectively burn holes into the different data frequency bands. If a band has a spectral hole, it represents a digital "zero," and if not, it represents a digital "one." Alternatively, the representations may be reversed. To read the information, a laser selectively interrogates each data band and if a spectral hole is detected by the optical detector it represents a "zero." If a spectral hole is not detected, it represents a "one." The spectral hole is detected by measuring the amount of light which passes through the material at the various data bands. The amount of data stored in any particular spot in the material depends on the ratio of the width of the material's absorption band (inhomogeneous linewidth) to the bandwidth of the individual holes (homogeneous linewidth). This varies depending upon the material, but there have been reports of storing up to approximately 2000 bits of information in a single optical spectrum. In other words, a single spot on the material can hold up to 2000 data bits, each bit recorded at a different frequency.

Examples of frequency domain spectral hole burning include U.S. Pat. No. 4,101,976 issued Jul. 18, 1978 by Castro, et al.; U.S. Pat. No. 3,896,420 issued Jul. 22, 1975 by Szabo; U.S. Pat. No. 4,297,035 issued Oct. 27, 1981 by Bjorklund; U.S. Pat. No. 4,306,771 issued Dec. 22, 1981 by Bjorklund; U.S. Pat. No. 4,533,211 issued Aug. 6, 1985 by Bjorklund, et al.; U.S. Pat. No. 4,158,890 issued Jun. 19, 1979 by Burland; W. Lenth and W. E. Moerner, "Grated Spectral Hole Burning Frequency Domain Optical Recording," Optics Communications, Vol. 58, No. 4, Jun. 15, 1986; and M. Yoshimura, et al., "Photochemical Hole Burning of Anthraquinone Derivatives in Acrylic Polymers," Chemical Physics Letters, Vol. 143, No. 4, Jan. 22, 1988. One problem with these systems is that it is difficult to reliably detect the small changes in light intensity as the laser sweeps the frequencies at higher speeds.

Time domain spectral hole burning is another type of data storage method. This technique uses a selectively pulsed laser to record data. The molecules of the inhomogeneously broadened material are first prepared for writing by the application of a powerful reference pulse which has a sufficiently broad frequency spectrum as to excite substantially all of the atoms in the material to an excited energy level. These reference pulses may be generated in three different ways: as a short pulse, (see W. Babbitt and T. Mossberg, "Time Domain Frequency Selective Optical Data Storage in a Solid State Material," Optics Communications, Vol. 65, No. 3, Feb. 1, 1988); or as a frequency swept or chirped pulse, (see Y. Bai, et al., "Coherent Transient Optical Pulse Shape Storage/Recall Using Frequency-Swept Excitation Pulses," Optics Letters, Vol. 11, p. 724, November 1986); or as a pseudo-random phase modulated pulse, (see J. Zhang, et al., "Use of Phase Noisy Laser Fields in the Storage of Optical Pulse Shapes in Inhomogeneously Broadened Absorbers," Optics Letters, Vol. 16, No. 2, Jan. 15, 1991).

The reference pulse is followed by a train of optical data pulses which are of lower intensity and centered at the same wavelength as the reference pulse. These data pulses represent the digital data delivered in a serial manner. This data sequence must be transmitted a short time after the reference pulse. The spectral components of the data sequence interact with the previously excited atoms and create a population grating which is stored in the material as spectral holes.

The information is read by applying a single reference pulse to the material. This reference pulse is similar to the first reference pulse which was used to record the information and excites the atoms in the material. However, there is now a population grating in the material which results in an excess of absorbing atoms at certain frequencies which are resonant with the spectral components of the data sequence. These excess absorbing atoms interact coherently to generate a photon echo. The photon echo is comprised of a series of time separated pulses which match that of the original data sequence. This photon echo is detected and reconverted into the original electrical data signal. However, the photon echo is exponentially decreasing in intensity and the signal waveforms are irregular, which make their detection difficult and expensive.

Examples of time domain systems are shown in T. Mossberg, "Time Domain Frequency Selective Optical Data Storage," Optics Letters, Vol. 7, No. 2, February 1982; M. Mitsunaga, et al., "248 Bit Optical Data Storage in $Eu3+:YAlO_3$ By Accumulated Photon Echo," Optics Letters, Vol. 15, No. 3, Feb. 1, 1990; M. Mitsunaga, et al., "Effects of Hyperfine Structures on an Optical Stimulated Echo Memory Device," Optics Letters, Vol. 11, No. 5, May 1986; M. Mitsunaga, "CW Photon Echo: Theory and Observations," Physical Review, Vol. 42, No. 3, Aug. 1, 1990; R. M. McFarlane, et al., "Sub-KiloHertz Optical Linewidths of the $7F_o \rightarrow 5D_o$ Transition in $Y_2O_3:Eu3+$," Optics Communications, Vol. 39, No. 3, Oct. 1, 1981; and N. N. Akhmedieve, "Information Erasing in the Phenomenon of Long Lived Photon Echo," Optics Letters, Vol. 15, No. 18, Sep. 15, 1990.

What is needed is a spectral hole burning data storage system which has a fast access time, high data density, and ease of data detection.

SUMMARY OF THE INVENTION

In a preferred embodiment of the present invention, a spectral hole burning data storage system is described which uses phase modulation to store data. An inhomogeneously broadened material is excited by a reference pulse from a laser. A laser data pulse follows the reference pulse and is phase modulated responsive to the data to be recorded. Spectral holes are thereby created in the material resulting in the creation of a unique population grating in the material's optical spectrum.

To read the data, another reference pulse is transmitted to the material. An echo pulse is created by the material and is received at an optical detector. The echo pulse is a signal which is a function of the population grating recorded in the material. A frequency shifted laser beam is also directed to the optical detector where it is combined with the echo pulse. The combination of the two light beams creates a heterodyne or beat optical signal which the optical detector converts to an electrical signal. This signal is received by a phase sensitive demodulator which detects the phase reversals and converts the electrical signal back into a digital data signal. The result is a data storage system which can achieve fast access times and high data density, as well as accurate and easy detection of the recorded data.

For a fuller understanding of the nature and advantages of the present invention, reference should be made to the following detailed description taken in conjunction with the accompanying drawings.

BRIEF DESCRIPTION OF THE DRAWINGS

FIG. 2A is a graph of light intensity versus time for the reference and data pulses;

FIG. 2B is a graph of phase versus time for the data pulse;

FIG. 2C is a graph of the digital representation of the data pulse;

FIG. 3A is a graph of light intensity versus time for the reference and echo pulses;

FIG. 3B is a graph of phase versus time for the echo pulse;

FIG. 3C is a digital representation of the echo pulse;

DESCRIPTION OF THE PREFERRED EMBODIMENT

Figure 1:
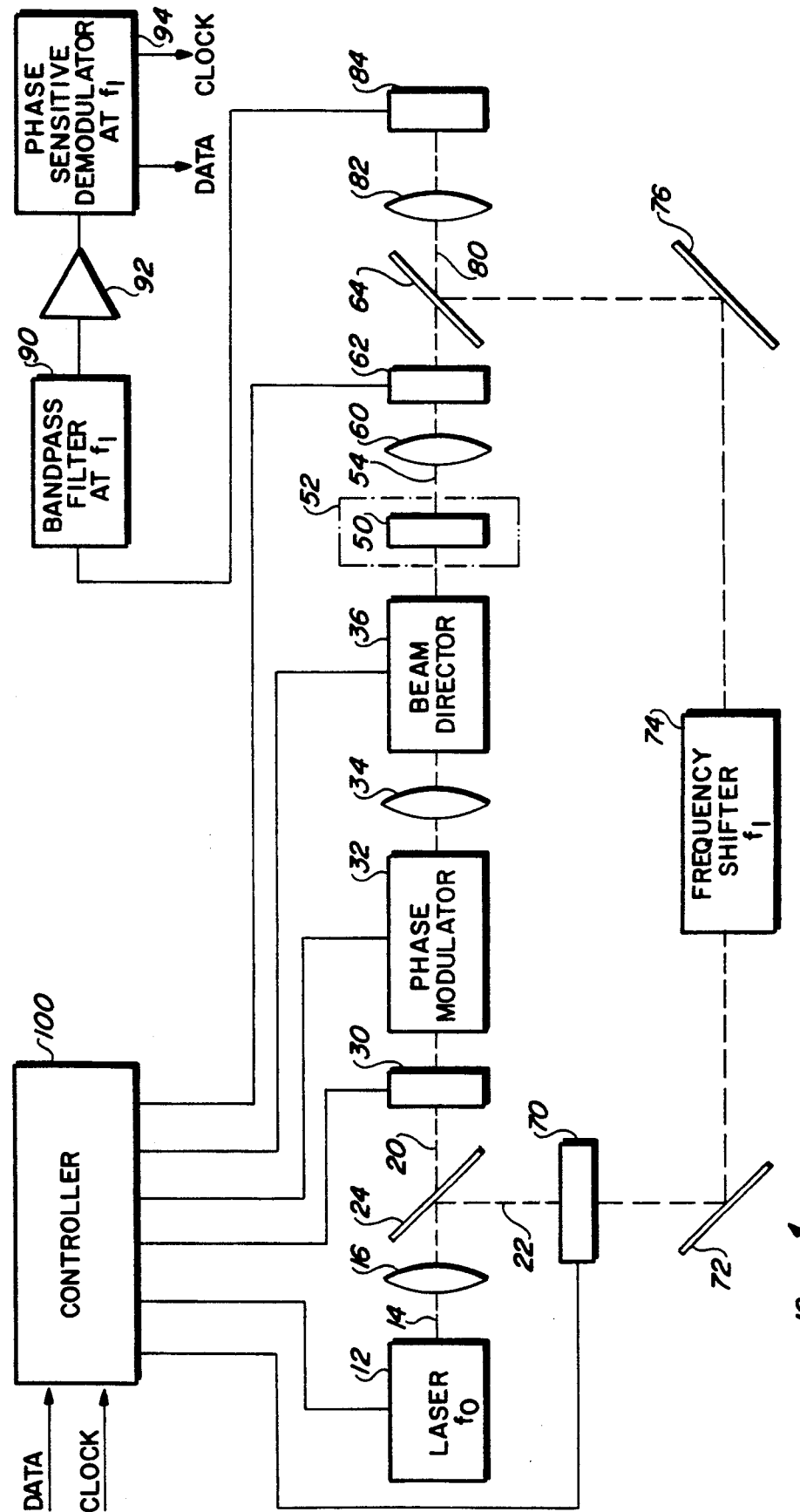
FIG. 1 is a schematic diagram of a data storage system of the present invention.

FIG. 1 shows a schematic diagram of a preferred embodiment of the spectral hole burning data storage system of the present invention and is designated by the general reference number 10. System 10 has a laser 12 which is preferably a single mode, frequency stabilized laser which emits radiation at a frequency $f_0$ and at a wavelength which substantially matches the absorption spectrum of the storage material. This wavelength may be substantially at the center of the absorption frequency spectrum of the storage material. In the preferred embodiment, a continuous wave dye laser may be used which generates light at 581 nm wavelength.

A radiation beam 14 is emitted from laser 12 and is collimated by a lens 16. Beam 14 is divided into a beam 20 and a beam 22 at a beamsplitter 24. Beam 20 passes through an optical gate 30. Gate 30 may preferably be an acousto-optic electrically controlled gate or an electro-optic modulator as are known in the art.

Beam 20 passes through a phase modulator 32. The phase modulator 32 may be an electrically controlled birefringent crystal as is known in the art, although other types of optical phase modulators may also be used. In a preferred embodiment, phase modulator 32 is a traveling wave electro-optic waveguide modulator.

Beam 20 passes through a focussing lens 34 to a beam director 36. Beam director 36 is electrically controlled to selectively deflect beam 20 at different angles in order to focus the beam to different spots on a data storage material 50. The beam director 36 may be an accousto-optical beam deflector, a galvo mirror, or other electrically controlled beam directors as are known in the art. In a preferred embodiment, beam director 36 is an acousto-optic deflector.

Storage material 50 is an inhomogeneously broadened material which is suitable for spectral hole burning. These types of materials are well known in the art. Examples of such materials include rare earth ions (e.g. Europium) in a crystaline matrix, $Y_2AlO_3$ and $Y_2SiO_5$. In a preferred embodiment, material 50 is made of europium doped, yttrium-silicate ($Eu3+:Y_2SiO_5$). Material 50 is preferably plate shaped and has a thickness which allows the transmission of light through the material. This thickness will, of course, vary depending upon the type of material used. In the preferred embodiment, the thickness is 5 mm.

Storage material 50 is in thermal communication with a an environmental control device 52. Device 52 may be a thermal device which maintains the material 50 at a proper temperature for spectral hole burning. The exact temperature depends upon the type of storage material 50 which is used. These exact temperatures are well known in the art. For the preferred material ($Eu3+:Y_2SiO_5$), the temperature is 1.7° K. The type of thermal device 52 is selected as appropriate depending upon the temperature requirements of the storage material 50. In the preferred embodiment, device 52 is cryogenic tank which receives a flow of liquid helium. Transparent windows are provided in the tank on each side of the material 50 to allow optical communication with the material 50.

A beam 54 passes from material 50 out of device 52 to a collimating lens 60 and then to an optical gate 62. Gate 62 is similar to gate 30. Beam 54 then goes to a beam combiner 64.

Beam 22 leaves beamsplitter 24 and passes to an optical gate 70. Gate 70 is similar to gate 30. Beam 22 is reflected by a mirror 72 to an optical frequency shifter 74. Frequency shifter 74 shifts the frequency of beam 22 by an amount $f_1$. For optimum operation, $f_1$ should be at least one GHz away from the frequency of $f_0$. In the preferred embodiment, $f_1$ is one GHz. Frequency shifter 74 may be any type of optical frequency shifter as is known in the art. In a preferred embodiment, shifter 74 is an acousto-optic frequency shifter. Beam 22 may be thought of as a comparison beam.

Beam 22 exits shifter 74 and is reflected by a mirror 76 to a beam combiner 64. Beam 22 is combined with beam 54 to create a beam 80. Beam 80 is focussed by a lens 82 to an optical detector 84. Detector 84 may be a photodiode optical detector as is known in the art.

Detector 84 is connected electrically to a band pass filter 90 which passes signals of frequency $f_1$. Filter 90 is connected to an amplifier 92 which, in turn, is connected to a phase sensitive demodulator 94 which is tuned to frequency $f_1$. Demodulator 94 may be a Biphase shift keyed demodulator as is known in the art.

A controller 100 is electrically connected to laser 12, gates 30, 62 and 70, phase modulator 32, and beam director 36. Controller 100 is a central processing unit (CPU) based controller having memory capability as is known in this art.

The operation of system 10 is now described. When it is desired to record data, controller 100 receives the digital data from a host device such as a computer. Optical gates 30, 62 and 70 are closed and laser 12 is energized to produce beam 14. Controller 100 adjusts beam director 36 to address a selected spot on the recording material 50. Laser 12 is energized to an intensity level appropriate for the generation of a reference signal.

Controller 100 causes a reference pulse to be generated. Gate 30 is opened and simultaneously phase modulator 32 is controlled to phase modulate beam 14 with a pseudo-random sequence of phase reversals. This exact sequence is stored in controller 100 such that the exact sequence may be regenerated whenever it is needed. After the sequence is completed, gate 30 is again closed. The result is that a reference pulse of time duration $t_r$ is generated at modulator 32. The phase modulation causes the reference pulse to have a broad band frequency which matches or exceeds the frequency spectrum of the material 50. The phase modulation sequence is selected to achieve the required broad frequency spectrum. In a preferred embodiment, the time of the reference pulse $t_r$ is 10 microseconds. A more detailed discussion of the generation of pseudo-random pulses is given in the reference by Zhang, et al. cited above.

The reference pulse is focussed by lens 34 and directed by beam director 36 to the desired spot on material 50. The reference pulse excites the atoms at the spot of the material 50 into an excited energy state.

Next, a data pulse is generated. Gate 30 is again opened and phase modulator 32 selectively phase shifts the light responsive to the data to be recorded. In a preferred embodiment, a data "one" is represented by a zero degree phase shift and a data "zero" is represented by a 180° phase shift. After the data sequence is completed, gate 30 is again closed. The number of bits which are contained in each data pulse depends upon the storage material 50 and the frequency at which the phase modulator 32 may be operated. In the preferred embodiment, phase modulator 32 can achieve approximately one GHz frequency and the data pulse may contain approximately $10^5$ bits.

The resulting data pulse will have different spectral power at different frequencies representative of the superposition of all of the phase reversals. This data pulse is focussed by lens 34 and directed by beam director 36 to the same spot on material 50 which was previously excited by the reference pulse. The data pulse causes selective spectral hole burning in the absorption spectrum of the material at that spot. The data has now been recorded in the material as the unique absorption spectrum at that spot. This absorption spectrum is relatively stable and depending upon the material may last a number of hours or a number of years.

The material 50 can maintain an excited state after receiving the reference pulse for only a certain period of time. This time is known as the dephasing time ($t_d$) of the material. Therefore, the end of the data pulse must be sent within the dephasing time period after the reference pulse has been sent. In the preferred embodiment, the dephasing time period is 500 μsec.

When it is desired to read data, controller 100 causes beam director 36 to access the appropriate spot on material 50. Controller 100 causes a reference pulse to be sent. The procedure for generating the reference pulse is the same as previously described. This reference pulse will be exactly the same as the earlier reference pulse which was used to record the information. Gate 30 is opened and closed for the appropriate time and the phase modulator 32 generates the reference pulse.

Immediately after gate 30 is closed and the reference pulse sent, gate 70 and 62 are opened. The reference pulse excites the electrons in the atoms of the material 50 to a higher energy level. However, now because of the spectral holes recorded in the material, there is a non-uniform frequency distribution. This causes an echo pulse to be emitted from the material 50. The echo pulse contains information on the population gratings caused by the original phase modulated data pulse.

The echo pulse 54 is collimated by lens 60 and passes through gates 62. At beam combiner 64 the echo pulse 54 and the beam 22 from frequency shifter 74 are combined. The resulting combined beam 80 is focussed by a lens 82 to detector 84. The combined beam has a heterodyne or beat signal. The detector 84 generates an electrical output signal which is responsive to the intensity of the beam 80. This signal is filtered at filter 90 such that only frequency $f_1$ is allowed to pass. The signal is amplified by amplifier 92 and passed to the phase sensitive demodulator 94. Demodulator 94 detects the phase modulations which are representative of the original data signal recorded. Demodulator generates a digital data signal and corresponding clock signal.

FIGS. 2A, B and C show graphical representations of the reference pulse and the data pulse. FIG. 2A shows the data pulse following the reference pulse. The data pulse is within the dephasing time period $t_d$ of the material 50. FIGS. 2B and C show the data pulse as a 14 bit digital signal which is encoded as phase transitions by the phase modulator 32.

FIGS. 3A, B and C show graphical representations of the reference pulse and echo pulse. FIG. 3A shows the echo pulse as an exponentially decaying light signal which contains information corresponding to the absorption spectrum of the recorded material 50. FIGS. 3B and C show the resulting detection of phase transitions in the signal and the final decoded digital signal as produced by the phase sensitive demodulator 94.

Figure 4A:
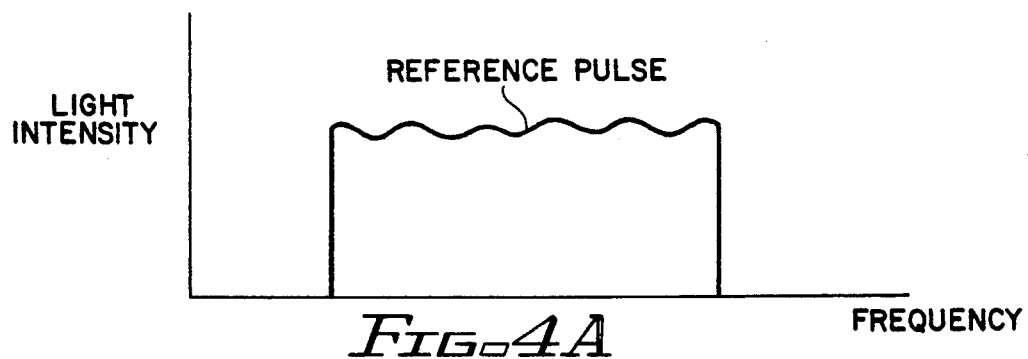
FIG. 4A is a graph of light intensity versus frequency for the reference pulse.
Figure 4B:
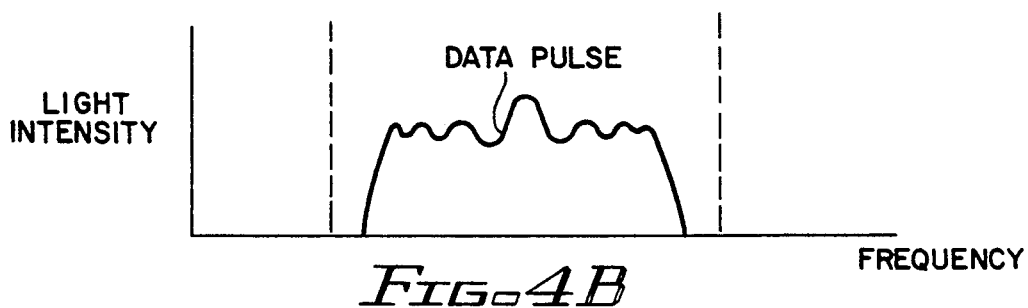
FIG. 4B is a graph of light intensity versus frequency for the data pulses.
Figure 4C:
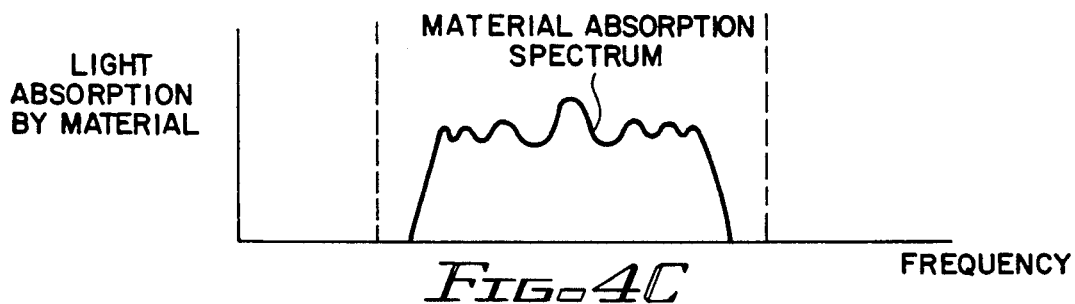
FIG. 4C is a graph of light absorption versus frequency for the data storage material.

FIGS. 4A, B and C show a graphical representation of the reference pulse, data pulse and material absorption spectrum as a function of frequency. FIG. 4A shows that the reference pulse covers a wide frequency spectrum. This frequency bandwidth is greater than the bandwidth of the material's absorption spectrum. The object is to uniformly excite as many of the atoms in the material as possible. FIG. 4B shows the spectrum of the data pulse which contains a superposition of the phase transitions applied by the phase modulator 32. FIG. 4C shows the material's absorption spectrum after the application of the data pulse. Spectral holes have been burned into the material such that the resulting spectrum mirrors the data pulse.

Figure 5:
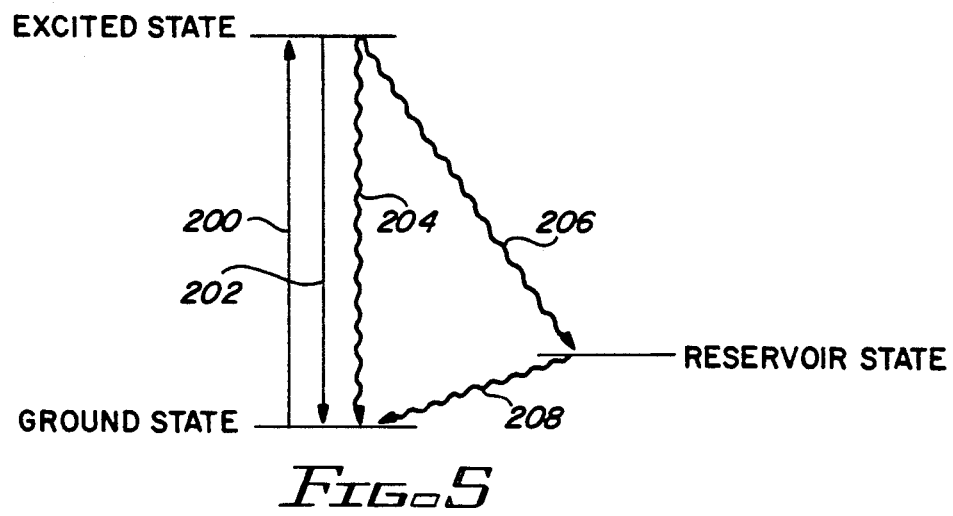
FIG. 5 is a schematic diagram of the different energy levels of the data storage material.

FIG. 5 shows a schematic of the energy levels of the atoms in the material 50. Initially, all of the atoms are in the ground state. When the reference pulse is applied a portion of the electrons are excited to the higher energy state. This is shown by arrow 200. Next, the data pulse is applied. Depending upon the spectrum of the data pulse, atoms will either be further pumped (in which case they will remain in the higher energy state), or they will made a stimulated transition back to the original ground state (shown by arrow 202). The atoms which return to the ground state cannot make spectral holes. After a period of time (known as the decay time), the remaining excited atoms will either decay back to the original ground state (shown by arrow 204) or will decay to a reservoir state (shown by arrow 206). The percentage of the electrons which will decay to either state depends upon the type of material used. In the preferred embodiment, approximately one third of the atoms that do decay will decay to the reservoir state. In the reservoir state, the atoms will now have a new natural frequency which is outside of the absorption frequency spectrum of the original material. It is these non-resonant atoms which form the spectral holes in the absorption band. Now when a reference pulse is applied, the atoms in the reservoir state have a frequency which is outside of the frequency bandwidth of the reference pulse and these atoms will not be affected by the reference pulse at all. Eventually, even the atoms in the reservoir state will decay back to the initial ground state. This is shown by arrow 208. However, this decay process 208 can take hours or many years depending upon the material. In the case of material which has spectral holes lasting only a few hours, the data storage system may be periodically read and refreshed as appropriate in order to maintain the integrity of the data recorded. This would be much like the refresh cycle in electronic dynamic random access memories.

System 10 is shown using a beam director to access different portions of material 50. However, other means, as are known in the art can also be used. For example, material 50 could be in the form of a rotatable disk and the light beam can be directed to the disk by means of a moveable optical head such as in standard optical recording disk drives.

Although the preferred embodiment uses a pseudo-random reference pulse, other reference pulses could also be used. A single short reference pulse can be obtained by pulsing the laser 12. Alternatively, laser 12 could be replaced by a frequency selectable laser and the reference pulse generated by frequency sweeping the laser across the absorption spectrum of the material.

While the preferred embodiments of the present invention have been illustrated in detail, it should be apparent that modifications and adaptations to those embodiments may occur to one skilled in the art without departing from the scope of the present invention as set forth in the following claims.

What is claimed is:

1. A data storage system comprising:
   an inhomogeneously broadened material;
   a means for generating a reference optical pulse directed at the material;
   a means for generating a phase modulated optical data pulse directed at the material;
   a means for generating a comparison optical pulse;
   an optical detection means for receiving an optical echo pulse from the material and for receiving the comparison optical pulse; and
   a phase detection means connected to the optical detection means for generating a data signal.

2. The system of claim 1, wherein the means for generating a phase modulated optical data pulse comprises a laser, an optical gate, and an optical phase modulator.

3. The system of claim 1, further comprising:
   an environment control device in thermal communication with the inhomogeneously broadened material.

4. The system of claim 3, wherein the environment control device comprises a cryogenic tank.

5. The system of claim 1, wherein the means for generating a comparison optical pulse comprises a beam splitter and a frequency shifter.

6. The system of claim 1, wherein the inhomogeneously broadened material is europium doped yttrium-silcate.

7. The system of claim 1, wherein the means for generating a phase modulated optical data pulse generates the phase modulated optical data pulse within a set period of time after the generation of the reference optical pulse, wherein the set period of time is a dephasing time period of the inhomogeneously broadened material.

8. The system of claim 1, further comprising means for selectively limiting the passage of optical signals between the inhomogeneously broadened material and the optical detection means.

9. The system of claim 1, wherein the reference pulse has a frequency spectrum sufficient to excite substantially all of the atoms in the inhomogeneously broadened material.

10. The system of claim 1, wherein the reference pulse is a pseudo-random phase modulated pulse.

11. A data storage system comprising:
    a laser;
    a beamsplitter in optical communication with the laser;
    a first optical gate in optical communication with the beamsplitter;
    an optical phase modulator in optical communication with the first gate;
    a means for controlling the phase modulator responsive to data to be recorded, connected to the phase modulator;
    an inhomogeneously broadened material in optical communication with the optical phase modulator;
    a second optical gate in optical communication with the inhomogeneously broadened material;
    an optical frequency shifter in optical communication with the beamsplitter;
    a beam combiner in optical communication with the second gate and the optical frequency shifter;
    an optical detector in optical communication with the beam combiner; and
    a phase detector connected to the optical detector.

12. The system of claim 11 further including:
    an environmental control device in thermal communication with the inhomogeneously broadened material.

13. The system of claim 11, wherein the inhomogeneously broadened material is europium doped yttrium-silicate.

14. The system of claim 11, wherein the laser generates a radiation beam which is at a frequency at substantially the center of the optical absorption spectrum of the inhomogeneously broadened material.

15. The system of claim 14, wherein the radiation from the laser is at a wavelength at substantially at 581 nm.

16. A method for data storage comprising the steps of:

transmitting a reference optical pulse to an inhomogeneously broadened material having spectral holes burned therein as a result of a phase modulated optical data pulse;

receiving at an optical detector an echo pulse from the material and a comparison optical beam, the comparison optical beam being of a frequency different from the reference pulse, and generating an electrical signal responsive thereto; and detecting phase transitions in the electrical signal and generating a digital signal.

* * * * *